United States Patent [19]

Okabayashi

[11] Patent Number: 4,933,010

[45] Date of Patent: Jun. 12, 1990

[54] SENSITIZING ACTIVATOR COMPOSITION FOR CHEMICAL PLATING

[75] Inventor: Kiyoshi Okabayashi, Tokyo, Japan

[73] Assignee: Eric F. Harnden, Redlands, Calif.

[21] Appl. No.: 239,935

[22] Filed: Sep. 2, 1988

[30] Foreign Application Priority Data

Jan. 12, 1988 [JP] Japan .................................. 63-3133

[51] Int. Cl.$^5$ ............................................. C23C 18/28
[52] U.S. Cl. ................................................. 106/1.11
[58] Field of Search ....................................... 106/1.11

[56] References Cited

U.S. PATENT DOCUMENTS 3,904,792  9/1972  Gulla et al. ...................... 427/30 X
3,961,109  6/1976  Kremer et al. ...................... 106/1.11
4,061,588  12/1977 Gulla ...................................... 427/98
4,604,299  8/1986  De Luca ............................... 427/98

FOREIGN PATENT DOCUMENTS 136473 11/1974 Japan .
 34220  9/1980 Japan .

OTHER PUBLICATIONS

Chem Abst 89:90843s, Okabayashi, 1978.

Primary Examiner—Theodore Morris
Attorney, Agent, or Firm—Poms, Smith, Lande & Rose

[57] ABSTRACT

Disclosed is a sensitizing activator for chemical plating operations, that uniformly and efficiently deposits a substance capable of catalytically depositing a plating metal from a plating solution, such as colloidal palladium, on the surface of a material to be plated. The activator includes stannous chloride and palladium chloride colloidally dispersed in a dilute solution of sulfuric acid and sodium chloride. The activator advantageously avoids corrosion of the black oxide that is formed on the inner copper foil of copper-clad laminates.

17 Claims, No Drawings

SENSITIZING ACTIVATOR COMPOSITION FOR CHEMICAL PLATING

BACKGROUND

The present invention relates to a sensitizing activator for chemical plating. Especially, the present invention relates to a sensitizing activator for use in chemical plating of through holes of a multi-layer printed circuit board. More particularly, the present invention relates to an improved sensitizing activator having an activity of uniformly and efficiently depositing a substance capable of catalytically depositing a plating metal from a plating solution, such as colloidal palladium, on the surface of a material to be plated in advance.

It is known that in conventional plating the operation of depositing a catalytic substance such as colloidal palladium on the surface of a resin should be performed before chemical plating. In order to reduce the manufacturing cost of a chemically plated product, how to deposit this colloidal palladium uniformly and efficiently is one of the important problems. The inventor previously found that by using an activating treating agent formed by adding vanillin and an acidic dye to a hydrochloric acid solution of palladium chloride, the amount of palladium used can be reduced and a product excellent in the plating quality over a conventional product can be obtained (see, for example, Japanese Patent Application No. 136473/1974). The inventor furthered his research and found that when a hydrochloric acid solution of palladium chloride and tin chloride is used instead of the hydrochloric acid solution containing palladium chloride alone as taught in the invention of Japanese Patent Application No. 136473/1974, colloidal palladium can be efficiently deposited and a product improved in the plating quality can be obtained by adding vanillin alone without using any acidic dye, as disclosed in Japanese Patent Publication No. 34220/1980.

The sensitizing activator proposed in the Japanese Patent Publication No. 34220/1980 (hereinafter referred to as "conventional technique") is effective in the sensitizing step in chemical plating of excellent quality plated through holes of a single layer printed circuit board. However, when this sensitizing activator is used for plating of through holes of a multi-layer printed circuit board, hydrochloric acid contained in th sensitizing activator causes corrosion of the black oxide that is normally formed on an inner copper foil of a copper-clad resin laminate board in the inner wall portions of the through holes of the copper-clad board, and the sensitizing activator permeates between the copper-clad resin laminate layers and is left therein and, since hydrochloric acid contained in the sensitizing activator has an electrical conductivity, the insulation between adjacent through holes becomes insufficient or the bonding between the copper-clad resin laminate layers is weakened to cause delamination.

Accordingly, in the case where the conventional sensitizing activator is used in the step of plating through holes of a multi-layer printed circuit board, the conditions such as dipping time, the concentration and the temperature are restricted and the process control is difficult. Namely, it is difficult to shorten the dipping time or reduce the hydrochloric acid concentration so that the black oxide of the inner copper foil of the resin laminate board is hardly corroded, and the sensitizing treatment is insufficient.

Therefore, there is a need for a sensitizing activator having an excellent performance, in which the above-mentioned defects are overcome.

SUMMARY

The present invention meets this need by providing a sensitizing activator obtained by colloidally dispersing stannous chloride and palladium chloride in dilute sulfuric acid containing a predetermined amount of sodium chloride. More specifically, it has been discovered that the defects of the conventional sensitizing activator object can be overcome by using sulfuric acid, which does not corrode the black oxide formed on the inner copper foil of the copper-clad resin laminate board, instead of conventional hydrochloric acid which corrodes this black oxide.

Preferably the activator includes 0.015 to 0.03 grams per liter of vanillin, 5 to 10 grams per liter of stannous chloride, 0.1 to 0.2 grams per liter of palladium chloride, 0.05 to 10 volume/volume percent of sulfuric acid, and 50 to 280 grams per liter of sodium chloride.

In one preferred formulation, the sodium chloride concentration is about 280 grams per liter, the sulfuric acid concentration being less than about 0.1 percent. In another preferred formulation, the sodium chloride concentration is about 50 grams per liter and the sulfuric acid concentration is about 5 percent.

In another aspect, the activator has the stannous chloride in a weight per unit volume concentration of about 25 to about 100 times a corresponding concentration of palladium chloride. Thus the activator can be supplied in concentrated form for later dilution by an aqueous sodium chloride and sulfuric acid solution, the sodium chloride and sulfuric acid being commonly available from sources local to an end use of the activator. In particular, the concentrated activator can be diluted to about 1 percent in volume in the sodium chloride sulfuric acid solution. The stannous chloride can be in a concentration of about 500 grams per liter, and the palladium chloride can be in a concentration of from about 10 to about 20 grams per liter. The activator can contain vanillin in a concentration of from about 0.075 to about 0.3 per unit of palladium chloride, preferably about 0.15.

The present invention is useful in the sensitizing treatment for facilitating general chemical plating, providing complete permeation and adsorbtion in fine hole portions of a material to be plated, for excellent uniformity of the plating. More particularly, the invention finds application in the plating of through holes of a multi-layer printed circuit board.

DESCRIPTION

In accordance with the present invention, there is provided a sensitizing activator for chemical plating, which comprises stannous chloride and palladium chloride colloidally dispersed in an aqueous solution of sodium chloride, which is used in the presence of sulfuric acid.

In 1 liter of the sensitizing activator for chemical plating, there are contained 0.015 to 0.03 grams/liter of vanillin, 5 to 10 grams/liter of stannous chloride, 0.1 to 0.2 grams/liter of palladium chloride, 0.5 to 5 volume/volume percent of sulfuric acid and 50 to 280 grams/liter of sodium chloride. The activator can be used, for example, in a saturated aqueous solution of sodium chloride (approximately 280 grams per liter) containing a small amount of sulfuric acid, from about 0.05 to 0.1 volume/volume percent of the sulfuric acid. For this example, 10 to 20 milliliters of a concentrate is added to 1 liter of the dilute sulfuric acid solution, the concentrate containing 0.015 to 0.03 grams of vanillin, 5 to 10 grams of stannous chloride, and 0.1 to 0.2 grams of palladium chloride in a saturated aqueous solution of sodium chloride.

The same concentrate can also be used in an aqueous solution containing about 50 grams per liter of sodium chloride and from 3 to 10 volume/volume percent of sulfuric acid, the concentrate being added to 1 liter of the less dilute sulfuric acid solution. It is preferred that the sulfuric acid concentration be approximately 5 volume/volume percent, for a high level of activation and minimal effect on the substrate.

The process for plating through holes of a multi-layer printed circuit board is generally conducted in the following order when using the activator of the present invention: a sensitizing treatment step; a soft etching step; an accelerating step; and a chemical plating step.

In the sensitizing treatment step, a copper-clad resin laminate board having through holes formed therein is dipped in the sensitizing activator of the present invention and colloidal palladium in the sensitizing activator is deposited on the surface inclusive of the inner walls of the through holes. In the soft etching step, the sensitized copper-clad resin laminate board is dipped in a solution of sodium persulfate to finely coarsen the copper surface and remove the oxide film. In each through hole, the sensitizing activator is left on the resin surface, and the sensitizing activator on the copper surface is removed because copper is slightly dissolved. In the accelerating step, the sensitizing activator deposited on the resin portion in the through holes of the copper-clad resin laminate board is activated to promote reaction of a chemical copper plating solution. The copper-clad resin laminate board which has passed through the soft etching step is dipped in an aqueous solution containing 10 volume/volume percent of sulfuric acid.

The sensitizing activator of the present invention is preferably used for plating of through holes of a multi-layer printed circuit board, but the use of the sensitizing activator is not limited to this plating and the sensitizing activator can be preferably used for other chemical plating processes.

The present invention provides a number of advantages in chemical plating processes, for example:

(1) Since the sensitizing activator for chemical plating according to the present invention does not contain hydrochloric acid as an ingredient, the sensitizing activator has no adverse effect of corroding black copper oxide formed on an inner copper foil of a multi-layer substrate, and therefore, such conditions as the dipping time, the temperature and the concentration are not restricted and a sufficient sensitizing treatment can be attained.

(2) Since the sensitizing activator for chemical plating according to the present invention enables a sufficient sensitizing treatment and can deposit colloidal palladium uniformly on the surface of a material to be plated, even with only a single application of the sensitizing treatment, there can be obtained such a covering capacity that copper can be completely deposited by chemical plating. This is true even if soft etching, accelerating and chemical plating are repeated several times. Therefore, a complete treatment can be accomplished without occurrence of defects that are readily caused in the steps of chemical plating of a multi-layer printed circuit board in the prior art, such as formation of voids (blank portions where chemical plating failed) because of a residual oxidizer or the like that was left after the treatment for removal of smear, commonly known as drill smear.

The present invention is advantageous over the conventional technique in the above-mentioned points in plating of through holes of a multi-layer printed circuit board. Also in the sensitizing activator of the present invention, colloidal particles are more finely dispersed than in the conventional technique, and therefore, when the sensitizing activator of the present invention is used at the sensitizing treatment widely in general chemical plating, the sensitizing activator completely permeates and is absorbed in fine hole portions of the material to be plated. Thus excellent penetration and absorption as well as uniform chemical plating can be attained.

An exemplary formulation of the sensitizing activator of the present invention was prepared for use in chemical plating of through holes of a printed circuit board as follows: In 1 liter of an aqueous solution of sodium chloride having a saturation concentration and containing 1.5 grams of vanillin was dissolved under heating 500 grams of stannous chloride and 10 grams of powdery palladium chloride to form a starting solution. Then, about 10 ml of the starting solution was added to 1 liter of an aqueous solution containing 50 grams of sodium chloride and having a concentration of 5 to 10 volume/volume percent of sulfuric acid.

In a test of this formulation, a copper-clad glass-epoxy resin laminate board having through holes formed therein, which had been subjected to a customary degreasing treatment, was dipped in this sensitizing activator for 2 minutes to effect a sensitizing treatment. Then, the laminate board was passed through the washing step, the soft etching step, and the accelerating step and was then subjected to chemical plating of copper. A chemical plating layer free of voids was formed in a state closely adhering to the copper foil without causing corrosion of the black oxide of the inner copper foil of the copper-clad resin laminate board, and a chemical copper plating layer excellent in the reliability of conduction of electricity was uniformly formed in the entire plated through holes.

Although the present invention has been described in considerable detail with reference to certain preferred versions thereof, other versions are possible. Therefore, the spirit and scope of the appended claims should not necessarily be limited to the description of the preferred versions contained herein.

What is claimed is:

1. A concentrated, hydrochloric acid free sensitizing activator for chemical plating, which comprises stannous chloride, and palladium chloride colloidally dispersed in an aqueous solution of saturated sodium chloride.

2. The activator of claim 1 further comprising an effective concentration of vanillin.

3. The activator of claim 1 wherein the stannous chloride is in a concentration of about 500 grams per liter.

4. The activator of claim 1 wherein the palladium chloride is in a concentration of about 10 grams per liter.

5. The activator of claim 1 wherein the sodium chloride is in a concentration of about 280 grams per liter.

6. The activator of claim 2 wherein the concentration of vanillin is about 1.5 grams per liter.

7. A concentrated, hydrochloric acid free sensitizing activator for chemical plating, comprising stannous chloride and palladium chloride colloidally dispersed in an aqueous solution of saturated sodium chloride and sulfuric acid, the stannous chloride and the palladium chloride having weight per unit volume concentrations in the ratio of from about 25 to about 100 for stannous chloride per unit of palladium chloride.

8. The activator of claim 7 diluted in a volumetric concentration of about 1 percent in an aqueous solution of sodium chloride and dilute sulfuric acid.

9. The activator of claim 7 wherein the stannous chloride is in a concentration of about 500 grams per liter.

10. The activator of claim 7 wherein the palladium chloride is in a concentration of from about 10 to about 20 grams per liter.

11. The activator of claim 7 wherein the sodium chloride is in a concentration of about 280 grams per liter.

12. The activator of claim 7 further comprising vanillin in a weight concentration of from about 0.075 to about 0.3 per unit of palladium chloride.

13. The activator of claim 12 wherein the weight concentration of vanillin is about 0.15 per unit of palladium chloride.

14. The activator of claim 8 wherein the sodium chloride is in a concentration of about 280 grams per liter and the sulfuric acid is in a concentration of between about 0.05 and about 0.1 percent.

15. The activator of claim 8 wherein the sodium chloride is in a concentration of about 50 grams per liter and the sulfuric acid is in a concentration of about 5 percent.

16. A method for chemically plating a substrate, comprising the steps of:
  (a) dipping the substrate into the sensitizing activator of claim 8;
  (b) rinsing the substrate; and
  (c) dipping the substrate into a chemical plating bath containing the metal to be plated.

17. The method of claim 16 further comprising, following the step of dipping the board into the sensitizing activator, the further step of dipping the substrate in an aqueous solution of sulfuric acid in a volumetric concentration of approximately 10 percent for accelerating the plating.

* * * * *